United States Patent [19]
Bucker et al.

[11] 4,192,720
[45] Mar. 11, 1980

[54] ELECTRODEPOSITION PROCESS FOR FORMING AMORPHOUS SILICON

[75] Inventors: Edward R. Bucker, Cranford; James A. Amick, Princeton, both of N.J.

[73] Assignee: Exxon Research & Engineering Co., Florham Park, N.J.

[21] Appl. No.: 951,580

[22] Filed: Oct. 16, 1978

[51] Int. Cl.² .......................... C25D 3/02; C25D 5/50
[52] U.S. Cl. ............................. 204/14 N; 136/89 TF; 204/37 R
[58] Field of Search ................. 204/14 N, 60, 37 R, 204/385

[56] References Cited
U.S. PATENT DOCUMENTS

| | | | |
|---|---|---|---|
| 3,022,233 | 2/1962 | Olstowski | 204/60 |
| 3,595,760 | 7/1971 | Ishibashi et al. | 204/14 N |
| 3,990,953 | 11/1976 | Austin | 204/14 N |

Primary Examiner—T. M. Tufariello
Attorney, Agent, or Firm—Paul E. Purwin

[57] ABSTRACT

A method for electroplating amorphous silicon from a non-aqueous solution containing a silicon solute wherein a heat treatment is requisite to producing stable coatings of photoconductive amorphous silicon.

15 Claims, 1 Drawing Figure

ELECTRODEPOSITION PROCESS FOR FORMING AMORPHOUS SILICON

FIELD OF THE INVENTION

The present invention relates to the art of electrochemistry and particularly to the electrodeposition of an amorphous silicon semiconductor. More specifically, the invention concerns the electrolytic deposition of a photoconductive layer of amorphous silicon containing hydrogen.

Photovoltaic devices such as silicon solar cells, well known in the art, are capable of converting photon energy into electrical energy. A principal impediment to the utilization of photovoltaic devices as an alternative to fossil fuel and nuclear generation of electricity is the cost of producing these solar cells. A major portion of the expense of manufacturing these cells is the cost of the semiconductor material. Generally, a silicon single crystal solar cell will require a relatively thick wafer (~20 mils) of semiconductor material. Of the 20 mil (508 microns) thickness of material, a thickness of about 8 mils (203 microns) is of operational necessity to the photovoltaic function of the device. Greater than 99% of the photon generated carriers to be collected are generated within that thickness.

Alternatives to single crystal wafers have been the object of extensive research in related fields of art. One such alternative, as disclosed in U.S. Pat. No. 4,064,521, is a thin film of amorphous silicon. Amorphous silicon, as described by Chittick in the *Journal of the Electrochemical Society, Vol.* 66, p. 77, 1969, is a semiconductor material displaying optical and electronic properties highly favorable to photoconductive and photovoltaic application. These favorable properties have been generally attributed by those skilled in the art to the presence of an appropriate content of hydrogen within the film. Although the precise nature of the hydrogen/silicon relation is not fully understood, it has been clearly shown in the art that the hydrogen content is critical to the photoconductive properties.

The prior art has generally fabricated films of amorphous silicon by the process of a glow discharge in silane or halogenated forms thereof. Another process has been described by W. Paul et al, in *Solid State Communications,* Vol. 20, p. 969, 1976, wherein the amorphous silicon layer is sputtered in the presence of hydrogen. Such processes require substantial equipment expenditures, employing sophisticated vacuum technology methods for thin film deposition. The present invention provides the ability to produce films of amorphous silicon by means of a relatively inexpensive electroplating of amorphous silicon onto an electrically conductive body.

PRIOR ART

Prior art teachings of electrodepositing silicon are directed toward producing silicon in an elemental form. U.S. Pat. No. 3,022,233 discloses a method for electroplating silicon from a fused salt. These processes require electrolyte temperatures in excess of about 450° C. and as high as 800° C. Such temperatures induce the formation of crystalline as opposed to amorphous silicon.

Reduced temperature electrodeposition of elemental silicon is taught in U.S. Pat. No. 3,990,953 wherein an example sets forth a technique for depositing silicon whose "surfaces of the deposited silicon showed most to be amorphous". Applicants' repeated efforts to duplicate the disclosed processes failed to produce stable films of amorphous silicon. As used here, the term stable, unless otherwise delimited, refers both to chemical and physical permanence. Physical instability in films refers to film recrystallization, reticulation and peeling from the supportive body. Chemical instability refers to a composition or chemical structure change in the film. All films produced in the manner taught by the prior art experienced severe reticulation and chemical decomposition upon exposure to room atmosphere. In general, films produced in such manner were both physically unstable and chemically different from amorphous silicon produced by the present invention.

Further investigations discovered that a post deposition heat treatment, nowhere taught in the prior art, was critical for producing stable films of amorphous silicon. A combination of temperature, time and ambient conditions are required to stabilize the otherwise unstable film.

The present invention provides important advantages over the prior art. Of most importance is the invention's method produces a physically durable, chemically stable, photoconductive layer of amorphous silicon, useful under normal atmospheric conditions as as is presently understood, a photosensitive semiconductor. Further processing advantages include the use of an improved solvent system and a less hazardous electrolyzer material than is taught in the prior art. The attendant advantage of a substantial reduction in the cost of producing this semiconductor facilitates commercial utility in areas other than electronic devices, such a protective coatings for corrosive applications, selective absorbing surfaces for solar collectors, and intermediates for the production of silicides, heretofore cost prohibitive.

SUMMARY OF THE INVENTION

Generally, the present invention contemplates a method for producing stable coatings of amorphous silicon. The method of electroplating amorphous silicon comprises passing an electric current through a nonaqueous electroplating solution containing a solute of silicon halide or halogenated silane soluble in an aprotic organic solvent, while under cover of an inert gas. Before exposure to air, the electrodeposit is heat treated in an inert and/or reducing atmosphere which heat treatment is critical to the production of a stable coating of amorphous silicon. The semiconductor material produced by this invention displays photoconductive properties favorable to its use in photovoltaics and other photosensitive semiconductor devices.

DETAILED DESCRIPTION OF THE INVENTION

Figure 1:
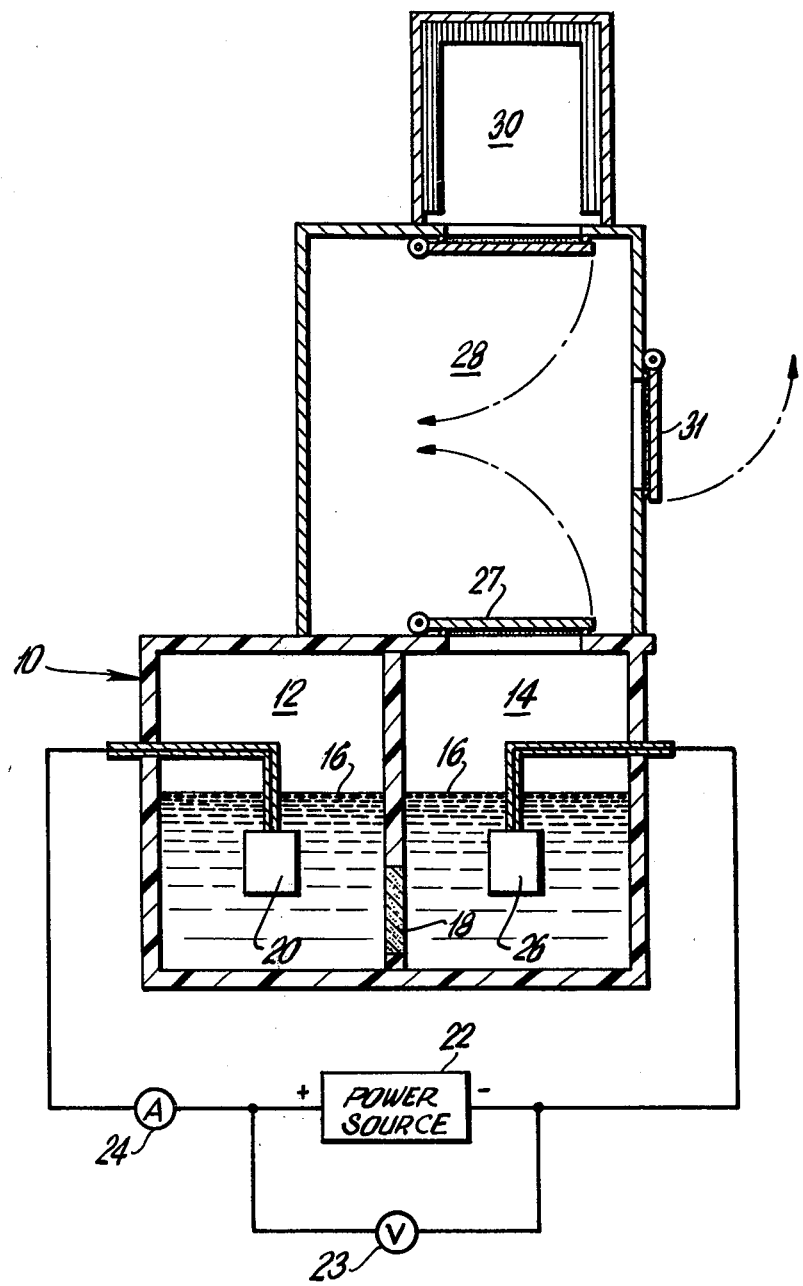

With reference to the drawings, the invention may be carried out in an essentially conventional electroplating apparatus adapted to avoid exposure of the electroplating solution to the atmosphere. A means is provided for transporting the workpiece to a heat treatment apparatus while remaining unexposed to the atmosphere. A heat treatment at about 350° C., while exposed to inert and/or reducing gases, extracts excess hydrogen from the film, producing a chemically and physically stable film of photoconductive amorphous silicon.

As illustrative thereof, in FIG. 1, an electroplating vessel (10), partitioned into an anode chamber (12) and a cathode chamber (14), is filled with an appropriate level of an electroplating solution (16). A lower portion

(18) of the partition, below the electroplating solution level, is permeable to the solution (16). The permeable partition (18), preferably constructed of sintered glass or similarly suitable materials, inhibits particulates from flowing between the anode chamber (12) and the cathode chamber (14). Although not illustrated, an inert atmosphere is maintained above the electroplating solution (16). Preferably all components to contact the electroplating solution are voided of residual matter by heating and/or gas purging prior to introducing the electroplating solution. Vessel (10) along with partition (18) and other components to contact the electroplating solution (16) are constructed of a material impervious to the corrosive nature of the electroplating solution.

An anode, vertically supported by a fixed member (21), is comprised of platinum or a similarly non-reducing material. The anode (20), immersed in the electroplating solution (16) is electrically connected to a conventional electroplating power source (22) which includes a means for controlling and monitoring the source potential (23) and/or current (24).

A cathode (26), immersed in the plating solution (16), is vertically supported by a fixed member (28) which passes through and is supported by the vessel wall (10). The cathode (26) is electrically connected to the power source (22). Although not illustrated, the cathode (26) and the electrodeposited film thereon are capable of being vertically transported from the cathode chamber (14) to an interlock chamber (28); and further to heat treatment chamber (30) by means of a conventional conveyor mechanism. The interlock chamber (28), containing vertically disposed air tight doors (27) and (29) segregates the inert atmosphere above the electroplating solution from the atmosphere of the heat treatment chamber (30). A purging sequence, employed but not illustrated, evacuates the interlock chamber (28) followed by backfilling the chamber with an appropriate gas, therein minimizing inter-chamber contamination. A third air tight door (31) providing access from the interlock chamber (28) to room atmosphere, facilitates loading the cathode (26) to the cathode chamber (14) and removing the cathode with the heat-treated film from the heating chamber (30). Cross-contamination of atmospheric gases and the interlock chamber (28) gases is similarly avoided by the previously mentioned purging sequence.

The heat treatment apparatus (30) is capable of heating the cathode (26) and the electrodeposited film thereon to a temperature of about 350° C. while providing an ambient of a gaseous helium, hydrogen or a mixture thereof.

The present invention employs a cathode body comprised of a conductive material impervious to the corrosive properties of the plating solution. Strips of platinum, nichrome, molybdenum and nickel have provided satisfactory substrates for the practice of this invention. The deposited films of amorphous silicon tend to delineate the milling marks on the substrate surface. An object of this invention being to produce an amorphous semiconductor suitable for use as a photovoltaic device, such surface discontinuities would be deleterious to the device performance. Therefore, in a preferred embodiment, thin films of nichrome and molybdenum were sputtered onto smooth glass substrates providing an essentially smooth surface absent the aforesaid surface discontinuities for the amorphous silicon to be deposited thereon.

The present invention employs silane, halogenated silane, silicon halides or a mixture thereof as a silicon source. This silicon source is hereinafter referred to as a silicon solute, a recognized term of art in electrochemistry. Halogenated silane compounds of the generic formula $H_ySiX_{4-y}$ wherein X may be Cl, Br, I or a mixture thereof and y is the integer 1, 2 or 3 are suitable silicon solutes. Silicon halides of the generic formula $SiX_4$ wherein X may be Cl, Br, I or a mixture thereof are similarly suitable silicon solutes. Silicon tetrachloride, a species of the prior generic formula, and trichlorosilane, a species of the latter generic formula, constitute preferred silicon solutes in the practice of this invention.

The solvent system of the present invention comprises a non-aqueous liquid aprotic organic compound in which the silicon sources are soluble at about room temperature and pressure. The term soluble here refers to a homogeneous mixture of solute in solvent as distinguished from a dispersion or suspension of a silicon source in a host electrolyte. Useful solvents are anhydrous to the extent that no traceable reaction of solvent water content and solute are detected in the deposited film. Preferred solvent systems contain about 5 ppm or less of water. Preparation of the solvent in its useful anhydrous form requires drying typically by contacting a molecular sieve in excess of 48 hours or equivalent techniques of water removal. Solvents which have proven satisfactory for the practice of this invention include tetrahydrofuran, dioxolane and acetonitrile.

An improved solvent, comprised of a combination of an aprotic liquid organic solvent and an aromatic solvent provides increased rates of deposition of amorphous silicon. Examples of improved solvent systems include: 50/50 tetrahydrofuran-benzene, 50/50 tetrahydrofuran-toluene, 50/50 1,3-dioxolane-benzene, 50/50 dioxolane-toluene. The addition of the aromatic solvent is of further advantage, reducing the granularity of the deposited film.

The use of the aforementioned solvent systems in the present invention requires a supportive electrolyte to provide sufficient ionic conductivity to permit the electrodeposition of silicon. The choice of auxiliary electrolytes is dictated by the solubility of the electrolyte in the solvent system, the conductivity imparted by the electrolyte, and their stability in the solvent/solute solution during electrolysis. The supporting electrolyte has also been shown to increase the solubility of the solute in the solvent system.

Tetrabutylammonium salts such as tetrabutylammonium-perchlorate area of sufficient solubility and impart sufficient conductivity to serve as useful supportive electrolytes. The stability of the perchlorate electrolyte in the present solvent/solute systems is presently not fully defined; however, its demonstrated instability in similar systems renders it undesirable. In a preferred embodiment, a combination of 50/50 tetrabutylammoniumperchlorate and tetrabutylammoniumbromide produces a stable auxiliary electrolyte of sufficient solubility and providing sufficient conductivity for the electrodeposition of silicon.

For purposes of this invention, the technique of electrolyzing the plating solution will appear conventional to those versed in the art. An electropotential of sufficient magnitude to reduce the silicon solute, is supplied to the electrode by a conventional power supply. Variations of a constant electropotential such as pulse plating and periodic reverse plating may be employed to advantage. Further variations of the electronic circuitry of the electroplating system, such as current or potential compensation, would appear obvious to one skilled in the art of electrochemistry and is clearly within the scope of this invention.

Amorphous silicon films produced in accordance with this invention include an amount of hydrogen within the film. Relative to the deposition parameters, an excess amount of hydrogen is believed to be incorporated into the electrodeposited films. Without further processing, the films are chemically altered and physically degraded upon exposure to air. A heat treatment, subsequent to deposition and prior to exposure to air, at about 350° C. in an inert gas such as helium, hydrogen or a mixture thereof serves to stabilize the amorphous silicon film, expelling an amount of the incorporated hydrogen. This heat treatment is critical to the chemical and physical permanence of the amorphous silicon film. Said treatment further provides the requisite content of hydrogen producing enhanced photoconductivity. Films produced without this heat treatment, or a heat treatment differing substantially therefrom, have been found to transform to oxides of silicon and physically deteriorate the film integrity upon exposure to room air. Such deteriorated films are not operative as photosensitive semiconductor devices.

Stable films of amorphous silicon, produced in accordance with this invention, display photovoltaic properties analogous to amorphous films produced by plasma decomposition of silane. Metals such as nichrome and molybdenum form ohmic or non-blocking contacts to the amorphous film. High work function metals such as platinum, palladium and iridium form Schottky barriers whereupon illuminating said film through said high work function metal produces a photovoltaic response.

The following examples are illustrative of the present invention and will provide those skilled in the art with a better understanding of the teachings disclosed herein.

EXAMPLE 1

A cathode body was prepared by sputtering a thin film of nichrome onto a borosilicate glass substrate at a bias of about 50 volts. 50 milliliters of a solvent mixture of 50/50 THF and benzene, suitably dried over a molecular sieve, is prepared under cover of an inert atmosphere in a carefully cleaned and outgassed vessel. Said solute preparation and all further operations requiring a cover of inert atmosphere are performed within a conventional glove box adapted to monitor the water content of its atmosphere. Flowing high purity nitrogen, dried by means of a heatless drier, provides the inert atmosphere within the glove box, maintaining an ambient water content $\leq 5$ ppm. A silicon solute of 2.0 cc of $SiCl_4$ along with a support electrolyte mixture of 2.0 g $(Bu)_4NBr$ and 2.0 g $(Bu)_4NClO_4$ are dissolved in the THF-benzene solvent. This solution is transferred to the electroplating vessel which has been carefully cleaned, outgassed and purged with inert gas. Particular attention is paid to the cleaning of the cathode surface to insure removal of foreign matter and absorbed gases which may affect the subsequent deposition. The aforementioned cathode, a platinum anode, and a platinum reference electrode are immersed into the plating solution and electrically connected to a P.A.R. model 173 potentiostat. A sintered glass disk, permeable to the plating solution, separates the anode and cathode chambers. An initial current density of 0.7 ma/cm$^2$ diminishes to 0.61 ma/cm$^2$ during the deposition period of 75 minutes. The electroplating solution remains at approximately room temperature and pressure throughout the deposition. The deposited film visually appears generally golden brown in color with multi-color overtones. The film is transferred to a heat treatment apparatus, remaining under cover of an inert atmosphere, where it is heated to a temperature of 350° C. for 30 minutes in the presence of He. The cooled sample was removed to the atmosphere and subjected to the following analytical methods. The absence of film reticulation is verified under a high power optical microscope. X-ray fluorescence analyses verify the films to be predominately Si, with minute traces of Cl and Cr. An X-ray fluorescence determination of the thickness of the silicon layer indicated a thickness of 3 microns $\pm 5\%$. X-ray diffraction data, in conjunction with the X-ray fluorescence data verified the coating to be amorphous silicon. An independent verification of the hydrogen content of the film is accomplished by plating onto a platinum electrode and subjecting same to a microcombustion analysis. The process is destructive and therefore done independent of the samples to be further analyzed. The photovoltaic properties of the nichrome sample were analyzed by forming a Schottky junction to the surface of the film. The photovoltaic properties were analogous to films prepared by plasma decomposition of silane.

EXAMPLE 2

Generally, the procedure of Example 1 is followed except that the heat treatment was performed at 250° C. for 30 minutes in the presence of He. The film transformed from an initial golden brown film to a greyish-white film after exposure to room temperature, the latter displaying no photoresponse.

EXAMPLE 3

This embodiment, constituting the process taught in the prior art, presents a comparative basis of distinguishing the present invention.

Generally, the procedure of example 1 is followed except that acetonitrile is employed as a solvent, tetrabutylammonium bromide as a support electrolyte and molybdenum as a substrate. The electrodeposited film was not heat treated after depositing. The sample was exposed to room air and analyzed in the same manner as example 1. The film quickly transformed in color from golden tan to greyish-white. The film suffered severe reticulation followed by peeling away from the substrate. X-ray flouorescence indicated a major constituent to be silicon; however, infrared spectral analysis indicated that the silicon was of the form of $SiO_2$ which was the major constituent of the film.

What is claimed is:
1. A method for producing a stabilized photoconducting semiconductor film of amorphous silicon containing hydrogen, said method comprising:
   electrolyzing a non-aqueous solution of a silicon solute selected from the group consisting of silane, halogenated silane, silicon halides or mixtures thereof dissolved in a liquid aprotic solvent, or a mixture of a liquid aprotic solvent and an aromatic solvent said solution further having a supporting ion additive electrolyte, soluable in said solution, and imparting sufficient conductivity thereto to permit the electro reduction of said solute;
   reducing said silicon solute to electroplate a film containing silicon onto a cathode body immersed in said solution;

heat treating said film in an oxygen free ambient at a temperature ranging from above about 250° C. to about 350° C. for a period sufficient to stabilize said film.

2. The method set forth in claim 1 wherein the step of heat-treating includes heating the electrodeposited film at a temperature of about 350° C. for a period of about 30 minutes in a non-oxidizing atmosphere.

3. The method set forth in claim 2 wherein the nonoxidizing atmosphere comprises helium, hydrogen, or a mixture thereof.

4. The method set forth in claim 2 or 3 wherein the step of heat-treating includes adjusting the level of hydrogen within said amorphous silicon film to produce enhanced photoconductivity.

5. The method set forth in claim 1 wherein the steps of electrolyzing and reducing is accomplished under the cover of an inert gas.

6. The method set forth in claim 1 wherein said solution is at about 23° C.

7. The method set forth in claim 1 wherein said supportive electrolyte comprises a mixture of tetrabutylammonium perchlorate and tetrabutylammonium bromide.

8. The method set forth in claim 1 wherein the non-aqueous solution contains less than 5 ppm of water.

9. The method set forth in claim 1 wherein said mixture is selected from the group consisting of:
tetrahydrofuran-benzene,
tetrahydrofuran-toluene,
1,3-dioxolane-benzene,
1,3-dioxolane-toluene.

10. The method set forth in claim 1 wherein said silicon halide comprises a compound of the formula $SiX_4$ where X is Cl, Br, I or a mixture thereof.

11. The method set forth in claim 1 wherein said halogenated silane comprises a compound of the formula $H_ySiX_{4-y}$ where X is Br, I, Cl or a mixture thereof and y is the integer 1, 2 or 3.

12. A method for producing a photo voltaic solar cell having a body of amorphous silicon comprising:
electrolyzing a non-aqueous solution of a silicon solute selected from the group consisting of silane, halogenated silane, silicon halide, or mixtures thereof being dissolved in a liquid aprotic solvent, or a mixture of a liquid aprotic solvent and an aromatic solvent, said solution further having a supportive ion additive electrolyte soluable in said solution and imparting sufficient conductivity thereto to permit the electro reduction of said solute;
reducing said silicon solute to electroplate a silicon containing film onto a cathode body immersed in said solution wherein said cathode comprises a metal which forms an ohmic contact to amorphous silicon;
heat treating said film at a temperature of about 350° C. in a non-oxidizing atmosphere containing hydrogen or helium, wherein said heat treating adjusts the hydrogen content of said film;
depositing a pellucid layer of a high work function electrically conductive electrode onto said stabilized film to produce a photovoltaic device.

13. The solar cell set forth in claim 12 wherein said ohmic contact comprises nichrome or molybdenum.

14. The solar cell set forth in claim 12 wherein said high work function metal comprises platinum, iridium or palladium.

15. A solar energy conversion cell produced by the method of claim 12.

* * * * *